(12) United States Patent
Hori et al.

(10) Patent No.: US 7,161,990 B2
(45) Date of Patent: Jan. 9, 2007

(54) PREDISTORTION AMPLIFIER

(75) Inventors: Kazuyuki Hori, Tokyo (JP); Toshiaki Kurokawa, Yokohama (JP); Shouhei Murakami, Yokohama (JP); Masamitsu Nishikido, Yokohama (JP); Norie Hara, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 682 days.

(21) Appl. No.: 10/307,433

(22) Filed: Dec. 2, 2002

(65) Prior Publication Data

US 2003/0108120 A1 Jun. 12, 2003

(30) Foreign Application Priority Data

Dec. 5, 2001 (JP) .............................. 2001-370826

(51) Int. Cl.
*H04L 25/49* (2006.01)
(52) U.S. Cl. .................. 375/297; 375/279; 375/329; 330/149; 330/298
(58) Field of Classification Search .............. 375/264, 375/279, 280, 286, 297, 329, 242, 244, 247, 375/251, 252, 259, 260, 261, 271, 295, 296, 375/316, 317, 318, 322; 330/149, 298, 250
See application file for complete search history.

(56) References Cited

U.S. PATENT DOCUMENTS

| | | | | | |
|---|---|---|---|---|---|
| 5,404,378 | A | * | 4/1995 | Kimura | 375/296 |
| 5,420,536 | A | * | 5/1995 | Faulkner et al. | 330/149 |
| 6,072,364 | A | * | 6/2000 | Jeckeln et al. | 330/149 |
| 6,591,090 | B1 | * | 7/2003 | Vuorio et al. | 455/126 |
| 6,836,646 | B1 | * | 12/2004 | Nagasaka | 455/126 |
| 2001/0007435 | A1 | * | 7/2001 | Ode et al. | 330/149 |
| 2003/0118125 | A1 | * | 6/2003 | Doi | 375/297 |
| 2005/0243946 | A1 | * | 11/2005 | Chung et al. | 375/297 |

FOREIGN PATENT DOCUMENTS

| | | |
|---|---|---|
| CN | 1299532 A | 6/2001 |
| EP | 1199814 A1 * | 7/1999 |
| JP | 10-032435 A | 2/1998 |
| JP | 10-145146 | 5/1998 |
| JP | 10-145146 A | 5/1998 |
| JP | 10-178414 A | 6/1998 |
| JP | 2000-022659 A | 1/2000 |
| JP | 2001-268150 A | 9/2001 |
| WO | WO99/57806 | 11/1999 |
| WO | WO00/39920 | 7/2000 |
| WO | WO01/63750 A1 | 8/2001 |

OTHER PUBLICATIONS

S. P. Stapleton, Amplifier Linearization Using Adaptive Digital Predistortion, Applied Microwave & Wireless, pp. 72,74,76-77, Feb. 2001.

* cited by examiner

*Primary Examiner*—Pankaj Kumar
*Assistant Examiner*—Naheed Ejaz
(74) *Attorney, Agent, or Firm*—Antonelli, Terry, Stout and Kraus, LLP.

(57) ABSTRACT

Unlike a prior art digital predistortion compensation device for determining a compensation coefficient based on absolute value information about a baseband complex input signal, the present invention performs distortion compensation calculation in accordance with a complex coefficient polynomial using real and imaginary parts of the baseband complex input signal as its variables.

4 Claims, 3 Drawing Sheets

PREDISTORTION AMPLIFIER

BACKGROUND OF THE INVENTION

The present invention relates to amplifiers and more particularly, to a predistortion type linearized amplifier which can be used in wireless transmitter or the like and can be operated with a low distortion and a high efficiency.

In these years, in an amplifier used in a mobile communication base station or the like, for the purpose of realizing its miniaturization and low cost, it is required to operate a power amplifier to produce a large output with a power efficiency as high as possible.

However, the large-output operational mode is largely influenced by a nonlinear input-output characteristic. Thus a nonlinear distortion takes place outside of a transmission frequency band and produces radio waves disturbing other systems. The amount of such disturbance radio waves is strictly restricted by the Radio Law, which makes it difficult to operate the amplifier with a large output. In order to solve this problem, there are proposes various types of techniques called "distortion compensation", wherein the power amplifier is made highly linear to reduce the amount of generated nonlinear distortion and to enable its large output operation.

As one of related art distortion compensation techniques, there is proposed a digital predistortion compensating device as disclosed in JP-A-10-145146. In the related art, a complex compensation coefficient is calculated on the basis of amplitude (power) information on a complex plane I+jQ when baseband I, Q signals are regarded as complex signals and the calculated coefficient is complex-multiplied by a baseband complex input signal to realize distortion compensation. However, no consideration is paid to argument of the complex signal. This system is valid for such a type of nonlinear distortion as amplitude modulation to amplitude modulation distortion (AM/AM conversion) known as nonlinear distortion in an ordinary amplifier or as amplitude modulation to phase modulation distortion (AM/PM conversion) which depends only on amplitude.

As mentioned above, the related art is valid only in the case where nonlinear distortion alone depending only on the amplitude with respect to a complex input signal is present. However, when consideration is paid to such a case that, for example, nonlinearity or gain deviation which is independent in each of real and imaginary parts of an orthogonal modulator is present in the orthogonal modulator, the input amplitude of the amplifier will depend not only on the absolute value of the complex input signal but also on the argument thereof. Accordingly, when a combination of the orthogonal modulator and power amplifier is viewed as a whole, compensation is required based on a correspondence relation between complex numbers, which results in difficult compensation with use of the compensation system based only on the amplitude information.

Further, when the power amplifier has a saturation output and the distribution function of the input signal has a highly large amplitude occurrence probability, e.g., follows a normal distribution, it becomes difficult to effectively prevent distortion generated when the large amplitude signal is saturated by the power amplifier.

In the arrangement of the related art, furthermore, a single baseband complex input signal is to be compensated for. Thus the related art arrangement is considered to hard to compensate for distortion generated when transmitting a so-called multicarrier signal obtained by modulating a plurality of complex signals with different carrier frequencies.

SUMMARY OF THE INVENTION

To solve the above problems in the above related art, in accordance with an aspect of the present invention, there is provided a predistortion amplifier which performs distortion compensation calculation not on the basis of only the amplitude of a baseband complex input signal but with use of a complex coefficient polynomial in two variables using real and imaginary parts of the complex input signal to thereby realize accurate distortion compensation. Further, when the complex coefficient used in the distortion compensation calculation is sequentially updated on the basis of a complex demodulation signal obtained by demodulating a transmission signal and the complex input signal, there can be obtained a distortion compensation characteristic which automatically follows even a change in the characteristics of the amplifier with time and is kept good at all times.

When a peak factor reducing device functioning to attenuate an amplitude exceeding a predetermined value to the predetermined value on the basis of the momentary amplitude of the baseband complex input signal is provided at a preceding stage of the predistortion amplifier, the signal amplitude can be suppressed to the predetermined value or less. As a result, the amplifier can prevent generation of distortion caused by saturation.

In addition, when a multicarrier combiner, which modulates a plurality of baseband complex input signals with complex carriers determined depending on a carrier spacing, adds together into a single complex signal, and then outputs it, is added at the preceding stage of the amplifier; the amplifier can effectively perform distortion compensation even for a multicarrier signal.

DETAILED DESCRIPTION OF THE EMBODIMENTS

The present invention will be explained in detail with reference to the accompanying drawings.

Figure 1:
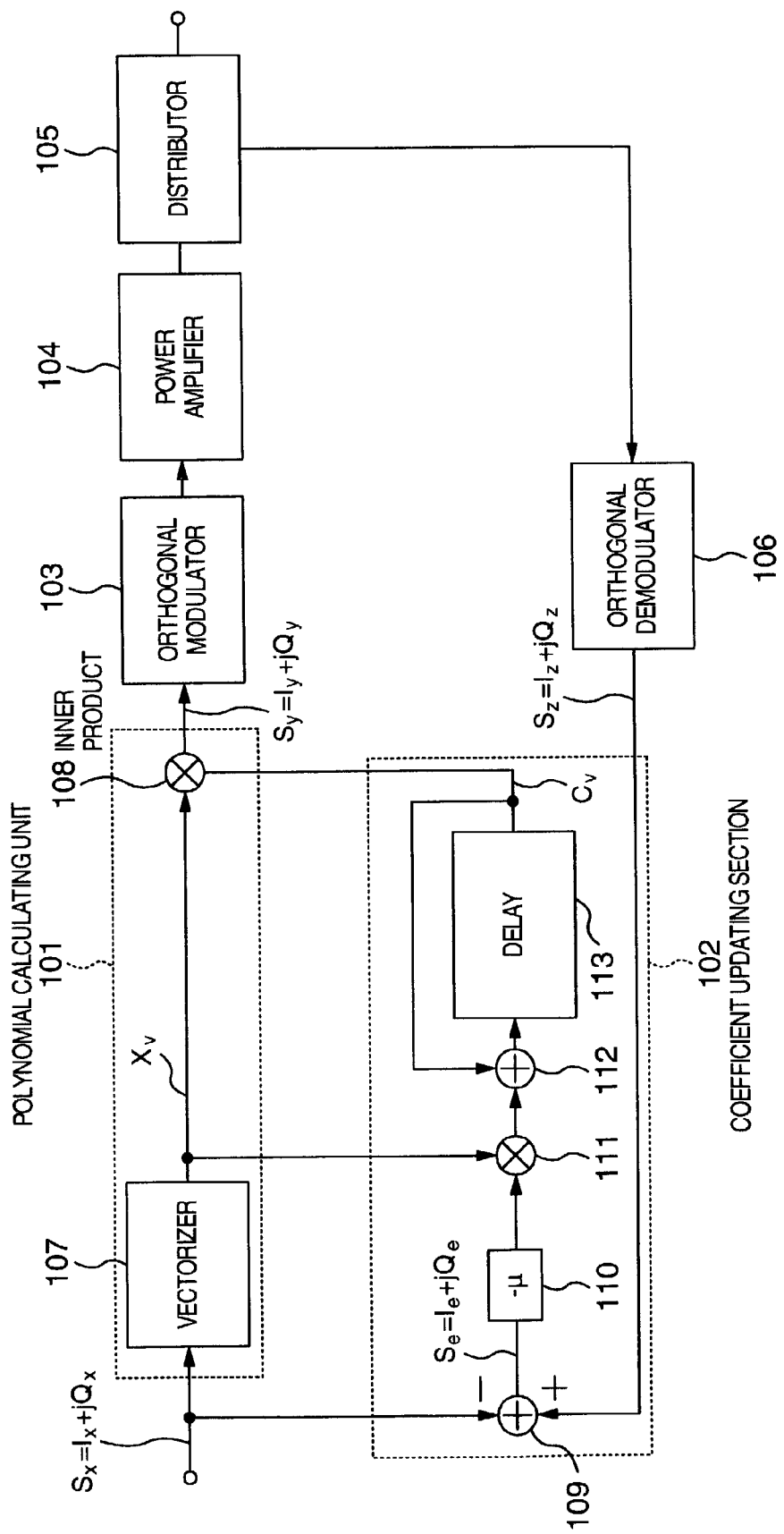
FIG. 1 is a block diagram of a first embodiment.

FIG. 1 is a block diagram of a first embodiment of the present invention. First, a baseband complex input signal Sx is represented by $Sx=Ix+jQx$. The baseband complex input signal Sx is input to a polynomial calculating unit 101 which calculates a two-variable polynomial of Ix and Qx having a complex coefficient. The polynomial calculating unit 101 has a vectorizing unit 107 for generating a vector signal Xv having such elements of the polynomial as shown in Equation (1) on the basis of the signals Ix and Qx, and also has an inner product calculating unit 108 for calculating an inner product of a coefficient vector Cv having a complex number ck as shown in Equation (2) and the vector signal Xv. By executing the inner product calculation, a complex signal Sy based on such a polynomial as shown in Equation (3) is obtained.

$$X_v = [1\ I_x\ Q_x\ I_x^2\ I_xQ_x\ Q_x^2\ I_x^3\ I_x^2Q_x\ I_xQ_x^2\ Q_x^3 \ldots] \quad (1)$$

$$C_v = [c_0\ c_1\ c_2\ c_3\ c_4\ c_5\ c_6\ c_7\ c_8\ c_9 \ldots] \quad (2)$$

$$S_y = I_y + jQ_y = c_0 + c_1I_x + c_2Q_x + c_3I_x^2 + c_4I_xQ_x + c_5Q_x^2 + c_6I_x^3 + c_7I_x^2Q_x + c_8I_xQ_x^2 + c_9Q_x^3 + \ldots \quad (3)$$

Next, an orthogonal modulator 103 carries out orthogonal modulation based on carriers perpendicular to the real and imaginary parts of the output signal Sy of the polynomial calculating unit. A power amplifier 104, further, amplifies an output signal of the orthogonal modulator 103 to a predetermined output power and outputs it, at which time nonlinear distortion is attached to the output. A distributor 105 distributes part of the output signal of the power amplifier. An orthogonal demodulator 106 performs orthogonal demodulation over the output signal of the orthogonal demodulator 106 to generate a baseband complex demodulation signal Sz.

The baseband complex demodulation signal Sz is then supplied to a coefficient updating section 102, wherein a difference signal Se=Sz−Sx from the input signal Sx is calculated by a subtractor 109. The difference signal Se is multiplied by −μ by a constant multiplier 110. In this case, μ may be set arbitrarily so long as it is sufficiently small positive number. An output of the constant multiplier 110 is then multiplied by the vector signal Xv in a multiplier 111. An integrating circuit, which has an adder 112 and a delay 113, performs sequential updating operation over such a coefficient vector as shown in Equation (4) with use of an output of the multiplier 111 as an update amount. As a result, the coefficient vector Cv converges with time into such a value that mean square value of the difference signal Se becomes smaller. After the coefficient vector converges sufficiently, the difference signal Se becomes nearly zero. For this reason, the update amount of the coefficient vector Cv becomes highly small. Accordingly, the updating of the coefficient vector is stopped, under which condition balance is kept.

$$C_v = C_v - \mu S_e X_v \quad (4)$$

In this connection, the vector signal Xv and the size of the coefficient vector Cv are determined by the degree of the 2-variable polynomial shown in Equation (3), so that the more the maximum degree of the polynomial is increased, the more the compensation accuracy is improved but the larger the vector size is. Thus a tradeoff is required between the amplifier size and vector size. Accordingly, a finite value may be set depending on the order necessary for realization of a desired accuracy.

As has been explained above, in accordance with the first embodiment of the present invention, since nonlinear distortion compensation is carried out as the polynomial having the real and imaginary parts of the baseband complex input signal as its two variables, effective compensation can be realized not only for the absolute value of the input signal but also even such nonlinear distortion that the compensation is difficult so long as its argument of the complex signal is not also considered.

Figure 2:
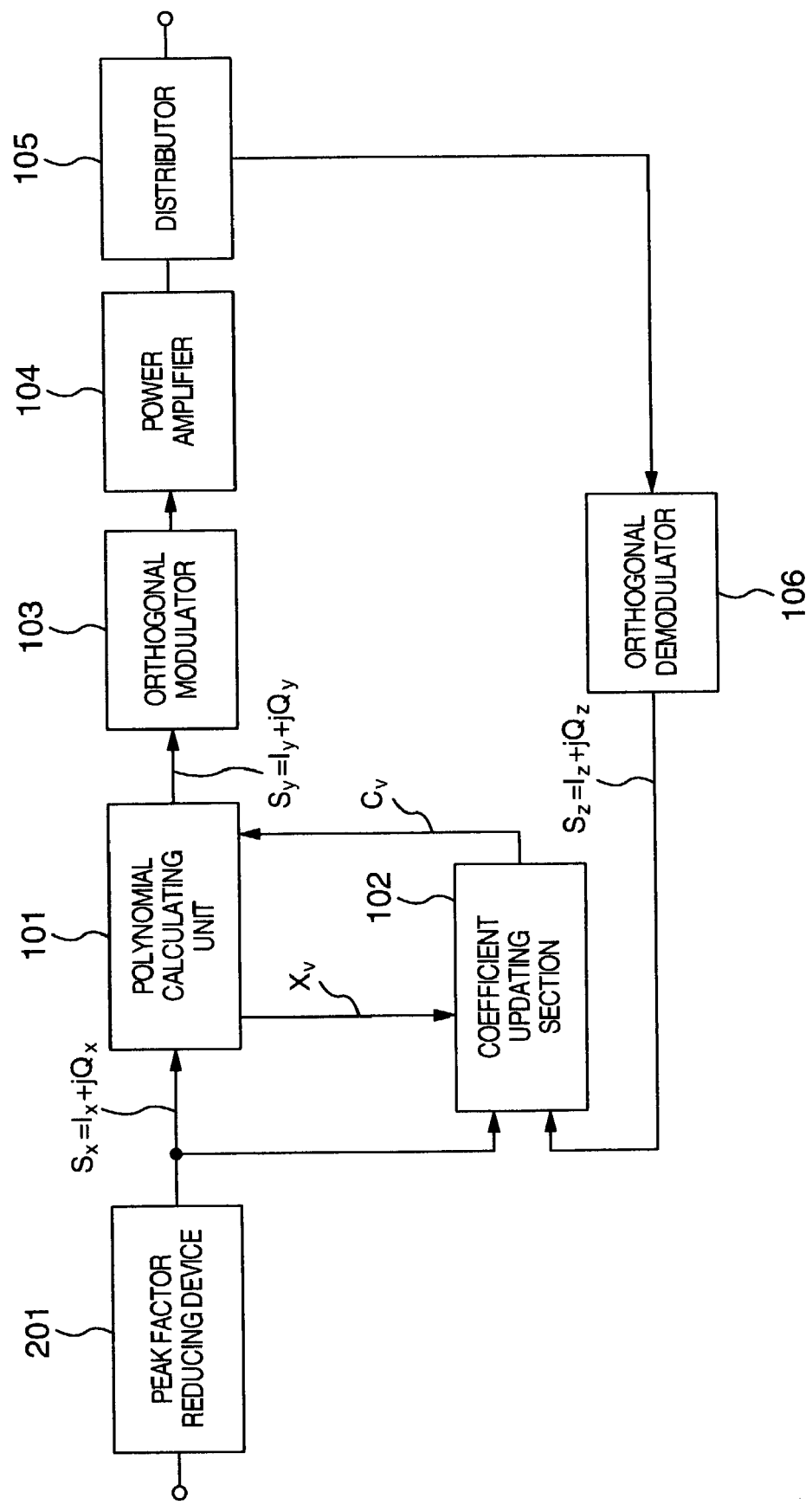
FIG. 2 is a block diagram of a second embodiment.

A second embodiment of the present invention will be explained by referring to FIG. 2. FIG. 2 shows an arrangement of the predistortion amplifier of FIG. 1 attached at its preceding stage by a peak factor reducing device 201 which attenuates an amplitude exceeding a predetermined value down to the predetermined value based on the instantaneous amplitude of a baseband complex input signal.

Various ways of realizing the peak factor reducing device can be considered. Simple exemplary one of the many ways is to insert a limiter circuit in the preceding stage of a baseband limiting filter to limit a large amplitude and to limit its band.

Assume now that a saturation output determined by the arrangement of the power amplifier 104 is present in the nonlinear input-output characteristic of the predistortion amplifier of FIG. 1 and thus the amplifier cannot output a signal amplitude exceeding the saturation output. Meanwhile, assuming that the baseband complex input signal follows a normal distribution as an example, then a very large amplitude may occur though an occurrence probability is low. In such a circumstance, it is, in principle, difficult to linearize a large amplitude signal part exceeding the saturation output by predistortion, which results in that the saturation of the output amplitude causes generation of distortion.

Meanwhile, a large amplitude signal has a low occurrence probability. So even if amplitude information about the large amplitude part is partially lost, it has a very slight effect on the entire communication quality deterioration. For this reason, with use of the arrangement of FIG. 2, a large amplitude exceeding a predetermined value is attenuated down to the predetermined value by the peak factor reducing device 201, whereby all the amplitude generated can be kept within the saturation amplitude of the power amplifier 104. It is only required to linearize the input-output characteristic in a region of the saturation amplitude or less by predistortion. As a result, nonlinear distortion including distortion caused by the saturation can be prevented from being generated.

Figure 3:
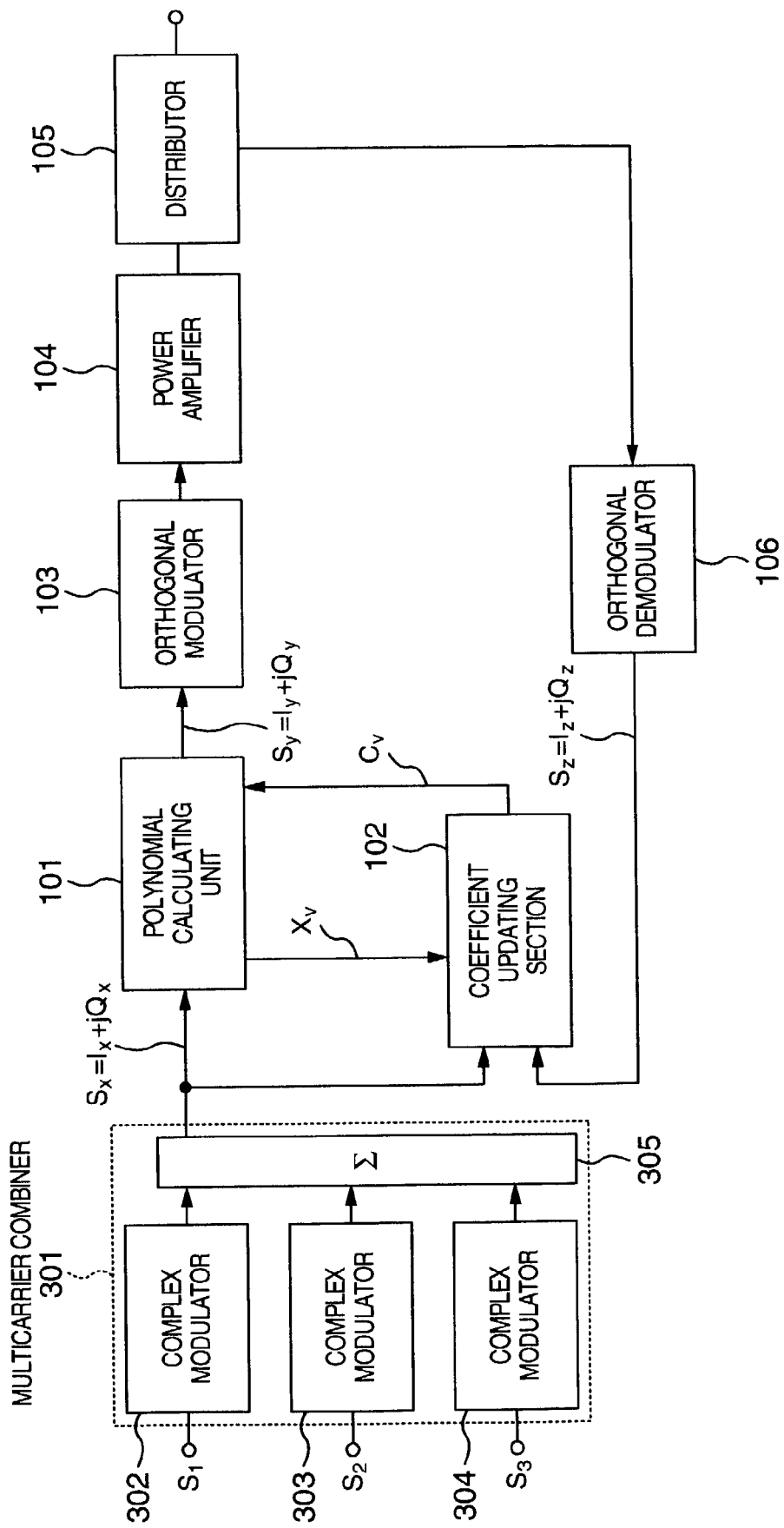
FIG. 3 is a block diagram of a third embodiment.

Explanation will be made as to a third embodiment of the present invention with reference to FIG. 3. FIG. 3 shows an arrangement of the arrangement of the embodiment of FIG. 1 attached at its preceding stage by a multicarrier combiner 301. The multicarrier combiner has complex modulators 302 to 304 for modulating three types of baseband complex input signals S1 to S3 with a complex carrier having a carrier spacing determined by system specifications, and also has an adder 305 for adding together output signals of the complex modulators 302 to 304 into a single complex signal and outputting the complex signal therefrom.

The embodiment of FIG. 1 has an arrangement capable of performing distortion compensation only over a so-called single carrier signal consisting of a single complex signal. However, when the multicarrier combiner 301 is attached to the preceding stage of the embodiment of FIG. 1, the combined arrangement can handle the multicarrier signal in a baseband region as a single complex signal. Therefore, the combined arrangement can perform effective distortion compensation even over the multicarrier signal.

The present embodiment has been explained in connection with the case where the three carrier signals are used. However, the present invention is not limited to the specific 3 carriers, and distortion compensation can be similarly realized over a multicarrier signal having an arbitrary number of carriers by increasing the number of complex modulators.

The multicarrier combiner 301 in the present embodiment can be attached also to the preceding stage of the second embodiment in exactly the same manner. And this arrangement can effectively prevent generation of nonlinear distortion in such a case that a saturation output is present in the input-output characteristic of the power amplifier 104 and further there is a high possibility that an input signal has a large amplitude.

As has been explained in the foregoing, in accordance with the first embodiment of the present invention, effective compensation can be attained even for such nonlinear distortion as determined depending upon not only the amplitude of a complex input signal but also the argument thereof. In accordance with the second embodiment of the present invention, distortion generation can be prevented even for such a large amplitude signal as difficult to be compensated for by predistortion. In accordance with the third embodiment of the present invention, effective compensation can be realized not only for a single carrier signal but also for a multicarrier signal.

In the present invention, in addition, distortion compensation calculation is carried out based on addition and multiplication and the need for previously storing a correspondence relation between input and output can be eliminated. Thus it is only required to previously store a multiplication coefficient alone and therefore a less storage capacity is advantageously required.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A predistortion amplifier comprising:
   a 2-variable polynomial calculating unit for performing predistortion of signals by calculating a polynomial using real and imaginary parts of a baseband complex input signal as its two variables and having a complex coefficient;
   an orthogonal modulator for performing orthogonal modulation of the real and imaginary parts of an output signal of the polynomial calculating unit using two carriers orthogonal to each other;
   a power amplifier for amplifying the output of the orthogonal modulator;
   a distributor for distributing the output of the power amplifier:
   an orthogonal demodulator for performing orthogonal demodulation over an output signal of the distributor and generating a baseband complex demodulation signal; and
   a coefficient updating section for sequentially updating a complex coefficient vector of the polynomial calculating unit on the basis of said baseband complex input signal and said baseband complex demodulation signal,
   wherein said 2-variable polynomial calculating unit comprises:
      a vectorizer for generating a 2-variable polynomial basis using said real
   and imaginary parts of said baseband complex input signal, and
      an inner product calculation unit for calculating an inner product of said 2-variable polynomial basis and said complex coefficient vector.

2. A predistortion amplifier wherein a peak factor reducing device for attenuating an amplitude exceeding a predetermined value down to the predetermined value on the basis of a momentary amplitude of the baseband complex input signal is provided at a preceding stage of the predistortion amplifier set forth in claim 1.

3. A predistortion amplifier wherein a multicarrier combiner for modulating a plurality of baseband complex input signals with a complex carrier determined depending on a carrier spacing, adding modulated signals together into a single complex signal, and outputting the single complex signal therefrom is provided at a preceding stage of the predistortion amplifier set forth in claim 1.

4. The predistortion amplifier wherein a multicarrier combiner for modulating a plurality of baseband complex input signals with a complex carrier determined depending on a carrier spacing, adding modulated signals together into a single complex signal, and outputting the single complex signal therefrom is provided at a preceding stage of the predistortion amplifier set forth in claim 2.

* * * * *